United States Patent [19]

Baranowski

[11] 4,085,433
[45] Apr. 18, 1978

[54] METHOD AND APPARATUS FOR IMPROVING PACKAGING DENSITY OF DISCRETE ELECTRONIC COMPONENTS

[76] Inventor: Conrad J. Baranowski, 27 Elmore St., Arlington Heights, Mass. 02174

[21] Appl. No.: 744,136

[22] Filed: Nov. 22, 1976

[51] Int. Cl.² .................................................. H05K 1/04
[52] U.S. Cl. ......................................... 361/396; 29/626
[58] Field of Search ............... 339/17 F; 361/398, 396; 174/68.5; 29/624–626

[56] References Cited

U.S. PATENT DOCUMENTS

| 2,682,018 | 6/1954 | Phillips | 361/398 |
| 2,693,584 | 11/1954 | Pifer | 361/398 |
| 2,911,572 | 11/1959 | Francis et al. | 361/396 |

FOREIGN PATENT DOCUMENTS 1,766,192  10/1969  Germany .............................. 361/398

OTHER PUBLICATIONS

Kamm, L. J., "All-Printed Circuit Electronic Assembly" *Electrical Manufacturing*, June, 1953.

*Primary Examiner*—David Smith, Jr.
*Attorney, Agent, or Firm*—James E. Mrose

[57] ABSTRACT

A method for increasing the packaging density of discrete electronic components. The components are mounted to a flexible printed circuit board at predetermined locations with normal orientation with respect to the board. The board is then folded in such a manner that the bodies of the components are mutually interleaved and are interleaved with other circuit components and terminals. A package with such interleaved components is also disclosed.

4 Claims, 4 Drawing Figures

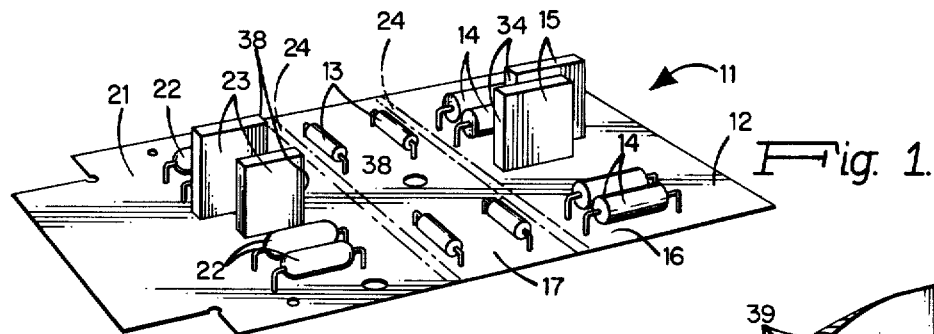
Fig. 1.
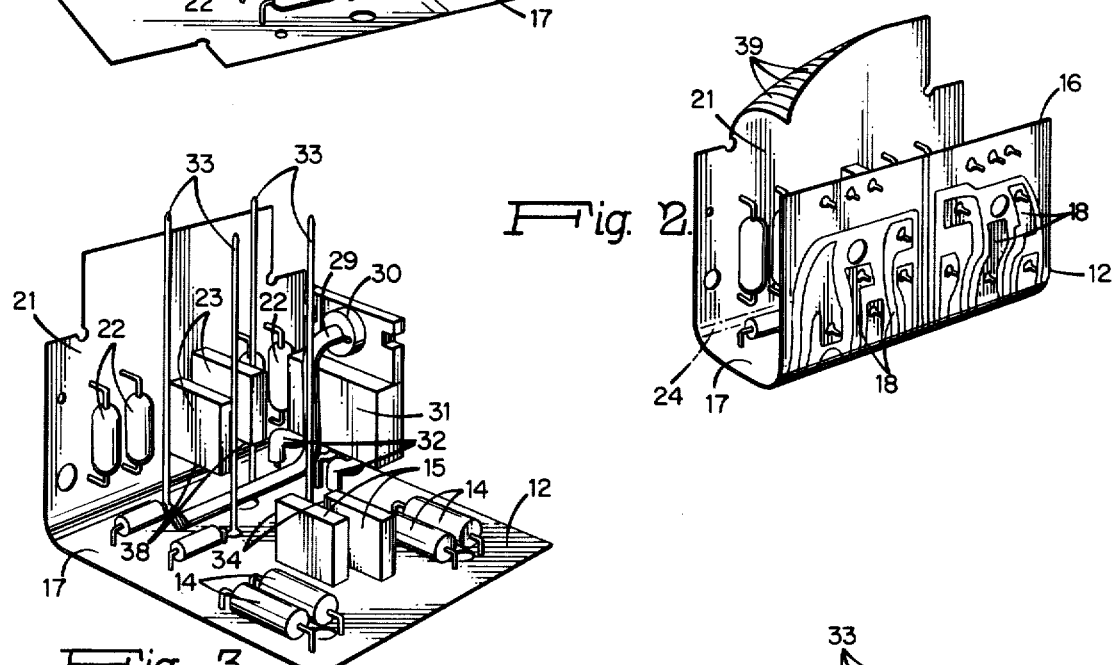
Fig. 2.
Fig. 3.
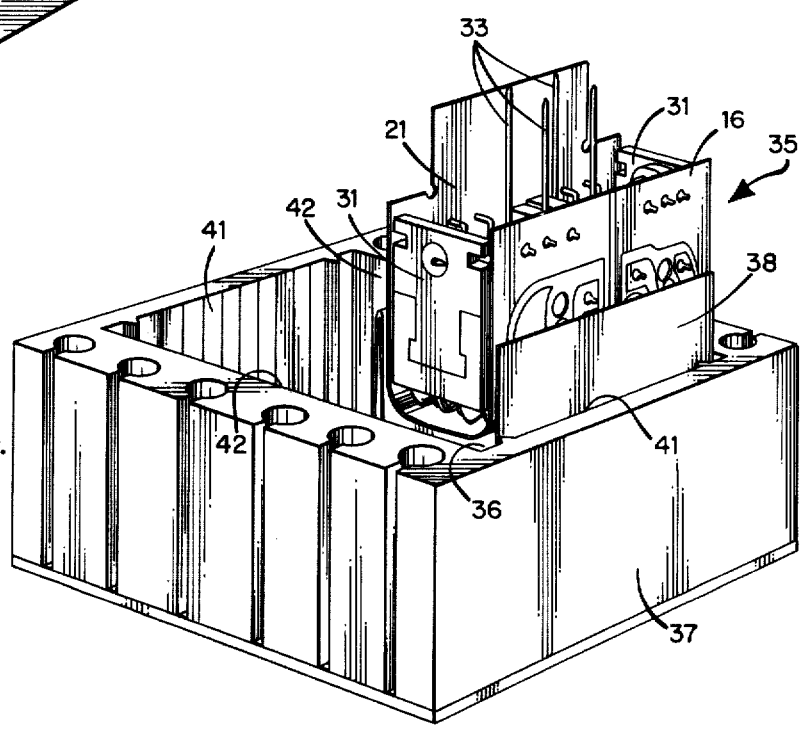
Fig. 4.

METHOD AND APPARATUS FOR IMPROVING PACKAGING DENSITY OF DISCRETE ELECTRONIC COMPONENTS

FIELD OF THE INVENTION

This invention relates generally to electronic packaging and is more particularly concerned with a method for increasing the packaging density of discrete electronic components in power modules.

DISCUSSION OF THE PRIOR ART

In electronic circuits and modules where discrete electronic components are employed, it is often desired to use as little space as possible for the components and their interconnecting circuitry. One common approach has been to mount the components in what is commonly called "cordwood fashion" where the components are mounted nose down, that is, the component is substantially perpendicular to the surface to which it is mounted, normally a printed circuit board. Examples of this type of component mounting are shown in U.S. Pat. Nos. 3,340,437, 3,354,353, 3,275,895 and 2,911,572. Another method for improved utilization of space in electronic packaging is to use a flexible printed circuit board folded in accordion fashion as shown in U.S. Pat. Nos. 3,780,353 and 3,873,889. A method similar to accordian folding is whereby printed circuits are rolled as shown in U.S. Pat. Nos. 2,703,853 and 2,647,224. In U.S. Pat. No. 2,748,321, components are mounted in alternating fashion on facing printed circuit boards but it does not appear to have the primary purpose of improving packaging density.

SUMMARY OF THE INVENTION

It is a primary object of the present invention to improve the packaging density of electronic power modules by means of flexible printed circuit boards having discrete electronic components mounted to them in such a fashion that when the board is folded upon itself, in face-to-face relationship, the components interleave thereby employing the least possible space for such components.

The method of this invention is accomplished by employing a flexible printed circuit board in a flat mode, positioning the circuitry and components thereon to allow the circuit to fold in predetermined places such that the components on facing portions of the folded printed circuit board will interleave. This enables the printed circuit surfaces to be in facing relationship as close together as possible with as many components as possible mounted thereto. This also permits the use of machines to bend the leads in conventional manner for mounting parallel to the surface of the printed circuit board and permits the use of wave or dip soldering for efficiency purposes because all of the components are mounted on the same side of the flexible circuit board.

The structure produced by the method of this invention comprises a U-shaped flexible printed circuit board having a plurality of discrete components mounted on one side thereof and wherein the components are mutually interleaved and also are interleaved with other components of the package of which the flexible printed circuitry is a part.

BRIEF DESCRIPTION OF THE DRAWING

The advantages, features and objects of this invention will be clearly understood from the following detailed description when read in conjunction with the accompanying drawing in which:

FIG. 1 is a perspective view of a flexible printed circuit board with components mounted thereto in accordance with this invention;

FIG. 2 shows in perspective the printed circuit board of FIG. 1 folded with interleaving components;

FIG. 3 is a perspective view of the flexible printed circuit board of FIG. 1 partially wrapped around a modular electronic component sub-assembly; and FIG. 4 shows the completed assembly of FIG. 3 about to be mounted in an enclosure.

DESCRIPTION OF THE PREFERRED EMBODIMENTS

With reference now to the drawing and more particularly to FIGS. 1 and 2 thereof, there is shown an electronic assembly 11 comprised of flexible printed circuit board 12 and tubular components 13 normally mounted parallel to the surface of board 12 at the middle portion 17 thereof. Other tubular components 14 are also mounted parallel to the surface on a first end portion 16 of board 12 along with relatively flat vertical type components 15. On the other end portion 21 of circuit board 12 are similar parallel mounted tubular components 22 and vertically extending rectangular components 23. The flexible board 12 is folded where indicated by dotted lines 24 to form the U-shaped configuration of FIG. 2, wherein end portions 16 and 21 are relatively close together and substantially parallel while vertically oriented components 15 and 23 are mutually interleaved and components 14 and 22 are closely adjacent.

The circuitry on the surface of board 12 is laid out in such a way that the components are mounted to permit folding generally along lines 24. The layout is also planned so that the components on opposite sides 16 and 21 such as 15 and 23 respectively which extend a substantial distance from the surface of board 12 will be permitted to interleave without electronic or physical interference. This configuration uses the least possible amount of volume for both the components and the printed circuitry necessary to be employed for a large number and variety of different power modules. As can be seen in FIG. 2, the circuit paths 18 of board 12 generally lie on the bottom surface of the board. In appropriate circumstances a double sided printed circuit board with plated-through holes could be used. However, the cost of such a board is approximately twice the cost of the single sided board shown and it would not likely be used in low cost applications.

The flexible board and components mounted thereto are often coupled with a modular sub-assembly partially shown in FIG. 3 wherein power semiconductors 31 are mounted above and at opposite edges of the central portion 17 of board 12 and are electrically interconnected therewith by leads 32. Two oppositely disposed power devices 31 are urged apart by means of a spring wire 29 coupled to each such device by slotted plastic button 30. The combination of the spring, plastic buttons and power devices may be termed a power sub-assembly and is shown in FIGS. 3 and 4 integrated with the folded flexible circuit assembly of this invention.

Terminals 33 extend upwardly from central portion 17 of the circuit board and when end portions 16 and 21 are folded as shown in FIG. 2, components 15 and 23 interleave not only with each other but with the standing terminals 33, the power semiconductors 31 and spring wire 29. Note that the edges 34 and 38 of components 15 and 23 respectively remain spaced from components 13 and spring wire 29 on central portion 17 of the circuit board when the circuit is folded to its final form, and that components 14 and 22 interleave with both terminals 33 and spring wire 29 urging power devices 31 apart. In the circuit assembly of FIG. 3, components 14 and 22 butt against or reside adjacent to power devices 31. In some instances such components may be arranged so that smaller ones are adjacent the board edges and larger ones are inboard so that there is some interleaving with power devices 31 even when the side of circuit board 12 does not make contact along the edges of the power devices. In FIG. 4, the margins of the circuit board along the edges thereof rest against the edges of the power devices and all of components 14 and 22 are inboard of the power devices and are interleaved therewith.

One or more of very compact modular circuit assembly 35 as shown in FIG. 4 can then be inserted into cavity 36 in modular enclosure 37. Normally a flexible insulator sheet 38 is used to isolate assemblies such as 35. Such a sheet may be sold under the trademark Mylar or be a laminate using Mylar. Sheet 38 prevents electrical shorting between adjacent assemblies 35 in an enclosure 37 and electrically insulates the flexible circuit with its soldered leads projecting therefrom from the enclosure walls.

Where an assembly 35 is used with other assemblies in an enclosure to make up a single circuit module, parallel printed circuit terminals 39 as shown in FIG. 2 may be employed for connections internal to the module, or to provide for subassembly testing. These terminals substantially provide any necessary access to the components of the flexible board assembly. End portions 16 and 21 of the circuit board may be juxtaposed with opposite walls 41 of enclosure 37 or with adjacent assemblies 35, while power devices 31 make contact with the other opposite walls 42 of the enclosure and are urged against those walls by means of spring 29. Appropriate heat sink and ground connections can be made to the enclosure walls from the circuit module 35 inserted in the cavity, specifically through the surfaces of devices 31 contacting the walls. Leads 33 provide the necessary external connections for the circuit assembly. While a single circuit assembly 35 is shown occupying cavity 36, it is likely that two or more such assemblies, together with other sub-circuit assemblies, would be placed into a larger enclosure. It will be recognized that different modular power circuits will have different components, both in number and size so that enclosures of different sizes will be required.

A specific example of a product which may be included in an enclosure 37 is a DC to DC modular power supply having four isolated outputs, typical performance being 24-32 volts DC input and dual plus or minus 5 volts at 1 amp and dual plus or minus 15 volts at 0.3 amps output. The module is made up of four basic building block sub-assemblies; a transformer assembly, a generator sub-assembly such as a flexible circuit 35, and two dual output sub-assemblies. The flexible circuit sub-assembly technique allows for mixing and matching generator and output sub-assemblies with the transformer assembly. The present product has three basic input generator sub-assemblies, 10 to 14 volts DC; and 20 to 32 volts DC; and 24-100 volts DC. There are basically three standard output sub-assemblies, dual 5 volts at 1 amp, dual 12 volts at 0.3 amps and dual 15 volts at 0.3 amps. Different combinations may be employed to make up a standard product line of 12 modules. Other input voltage requirements and output voltages are possible but would be considered to be special. This flexible circuit sub-assembly construction allows for stocking of sub-assemblies so as to reduce the stocking of finished modules. Modules can be made to order on short notice by interconnecting the four sub-assemblies mentioned above and inserting them into an enclosure.

In view of the above description, it will be apparent that this invention offers several advantages over the prior art. Prior to wave or dip soldering, all of the components are mounted to a flat, two-dimensional printed circuit board. At this time all component holes and spacings are easily accessible. Another positive aspect is that automatic insertion of components into the flexible circuit is possible, which is not true of cordwood type mounting. Further, exact three-dimensional location of components in the completed module in enclosure 37 is not necessary, although relatively exact location of the components on the board surface must be accomplished. In the bending/folding operation the components can take a relatively free position due to the flexibility of board 12 thus reducing possible solder joint stresses which could be caused in a hard board if components actually touched and interfered somewhat with one another. In a similar manner, the location of bend 24 is not critical, that is, it may vary by a few thousandths of an inch. The bends of opposite end portions 16 and 21 of the board with respect to center section 17 need not be precisely 90° but as close thereto as possible is best for optimum use of space.

From the foregoing detailed description it is likely that modifications and improvements will occur to those skilled in the art which are within the scope of this invention.

What is claimed is:

1. A method for increasing packaging density of discrete electronic components mounted to a flexible printed circuit board, said method comprising the steps of:

laying out the printed circuit pattern and component and terminal locations on said flexible board, on first and second spaced portions thereof and on a central portion by which the spaced portions are separated, to facilitate folding said flexible board along a fold line common to the first portion and the central portion and along another fold line common to the second portion and the central portion and to prevent interference between components when said flexible board is folded along the fold lines with the spaced portions in confronting relationship;

positioning components and terminals at the laid-out locations on the spaced and central portions on one side of said flexible board with the components in orientations generally parallel with the surface of the board;

soldering the leads of the components and terminals on the side of the board opposite to the components to secure the components and terminals physically to the board and make electrical interconnections between the printed circuit pattern and the components and terminals; and folding said flexible board along the fold lines so that said first and second portions of said board are substantially parallel and relatively close together in face-to-face relationship substantially perpendicular to and separated by the width of the central portion, at least some of said components and terminals on said first and second and central portions being in mutual interleaving relationship.

2. A method for constructing an electronic circuit module comprised of a flexible printed circuit board, discrete electronic components and terminals, and a modular sub-assembly of elements, said method comprising the steps of:

laying out the printed circuit pattern and locations of the components and sub-assembly elements on said flexible board, on first and second spaced portions thereof and on a central portion by which the spaced portions are separated, to facilitate folding said flexible board substantially along a fold line common to the first portion and the central portion and along another fold line common to the second portion and the central portion and to prevent interference between components and elements when said flexible board is folded along the fold lines with the spaced portions in confronting relationship and the modular subassembly therebetween;

positioning components at the laid-out locations on one side of said flexible board;

securing said components physically to said flexible board to thereby make desired electrical interconnections; and folding said flexible board along the fold lines and around said modular sub-assembly so that said first and second spaced portions of said flexible board are substantially parallel and separated by the width of the central portion with said modular sub-assembly therebetween, at least some of said discrete components interleaving with elements of said modular sub-assembly.

3. A method for constructing an electronic circuit module comprised of an enclosure having a cavity therein, a flexible printed circuit board, discrete electronic components, elongated terminals accessible outside said module, said method comprising the steps of:

laying out the printed circuit pattern and components and terminal locations on said flexible board, on first and second spaced portions thereof and on a central portion by which the spaced portions are separated, to facilitate folding said flexible board substantially along a fold line common to the first portion and the central portion and along another fold line common to the second portion and the central portion and to prevent interference between components when said flexible board is folded along the fold lines with the spaced portions in confronting relationship;

positioning components and terminals at the laid-out locations on the spaced and central portions on one side of said flexible board with the components in orientations generally parallel with the surface of the board;

securing said components and terminals physically to said flexible board by soldering on the side of the board opposite to the components of thereby make desired electrical interconnections;

folding said flexible board along the fold lines so that said first and second portions of said flexible board are substantially parallel and relatively close together in face-to-face relationship substantially perpendicular to and separated by the width of the central portion, at least some of said components and terminals on said first and second portions being in mutual interleaving relationship, at least some of said components interleaving with the terminals; and placing said combined flexible board, components and terminals in said cavity in said enclosure, with free end portions of the terminals extending therefrom.

4. An electronic circuit module comprising:
an enclosure having a cavity therein;
at least one electronic circuit assembly mounted in said enclosure, said circuit assembly comprising:
a modular sub-assembly comprised of electronic components extending from one wall of said cavity to the opposite second wall;
a flexible printed circuit board having discrete electronic components mounted along one side thereof on first and second portions which are separated by a central portion;
a plurality of elongated terminals extending upwardly from said one side of said board at said central portion thereof;
said flexible board being folded along two fold lines which are respectively common to the first of said portions and said central portion and common to the second of said portions and said central portion so that the facing first and second portions thereof are substantially parallel and separated by the width of said central portion, at least some of the components mounted thereto being in mutually interleaving relationship, at least some of said components being in interleaving relationship with said elongated terminals and elements of said modular sub-assembly, and the sides of said flexible board opposite the component side facing the opposing third and fourth walls of said cavity.

* * * * *